United States Patent
Johnson et al.

(10) Patent No.: US 7,201,217 B2
(45) Date of Patent: Apr. 10, 2007

(54) COLD PLATE ASSEMBLY

(75) Inventors: Scott T. Johnson, Torrance, CA (US); David T. Winslow, Culver City, CA (US)

(73) Assignee: Raytheon Company, Waltham, MA (US)

( * ) Notice: Subject to any disclaimer, the term of this patent is extended or adjusted under 35 U.S.C. 154(b) by 60 days.

(21) Appl. No.: 11/135,683

(22) Filed: May 24, 2005

(65) Prior Publication Data

US 2006/0266508 A1 Nov. 30, 2006

(51) Int. Cl.
F28F 3/12 (2006.01)

(52) U.S. Cl. .................. 165/170; 165/80.4

(58) Field of Classification Search ............. 165/170, 165/185, 80.4, 80.5
See application file for complete search history.

(56) References Cited

U.S. PATENT DOCUMENTS

| | | | |
|---|---|---|---|
| 5,016,090 A * | 5/1991 | Galyon et al. | 257/714 |
| 6,827,135 B1 * | 12/2004 | Kramer et al. | 165/80.4 |
| 7,000,684 B2 * | 2/2006 | Kenny et al. | 165/80.4 |
| 2004/0256092 A1 * | 12/2004 | Winslow et al. | 165/80.4 |

* cited by examiner

Primary Examiner—Teresa J. Walberg
(74) Attorney, Agent, or Firm—Leonard A. Alkov; Karl A. Vick

(57) ABSTRACT

A cold plate assembly, which in one embodiment includes a manifold layer comprising one or more input coolant sub-manifold channels and one or more output coolant sub-manifold channels. A metering plate having a plurality of orifices defined there through is disposed adjacent the manifold layer in spaced relation to a cover plate. A core layer is disposed between the metering plate and cover plate, the core layer comprising corrugated fin material. The input sub-manifold channels and output sub-manifold channels are in fluid communication through fluid paths passing through the orifices in the metering plate and the core layer.

30 Claims, 3 Drawing Sheets

COLD PLATE ASSEMBLY

This invention was made with Government support under Contract No. F33615-02-C-2213 awarded by the Department of the Air Force. The Government has certain rights in this invention.

BACKGROUND

Some electronics applications employ densely packed electronics packages, e.g. power supply and signal conditioning electronics. The electronic packages can produce significant heat loads, and may need cooling systems for proper thermal management. For example, some present or contemplated electronics packages may present surface heat densities exceeding 100 watts per square inch. There is a need for a cooling system which can address significant heat loads for electronics packages.

SUMMARY OF THE DISCLOSURE

A heat exchanger is disclosed, which in one embodiment includes a manifold layer comprising one or more input coolant sub-manifold channels and one or more output coolant sub-manifold channels. A metering plate having a plurality of orifices defined there through is disposed adjacent the manifold layer in spaced relation to a cover plate. A core layer is disposed between the metering plate and cover plate, the core layer comprising corrugated fin material. The input sub-manifold channels and output sub-manifold channels are in fluid communication only through fluid paths passing through the orifices in the metering plate and the core layer.

BRIEF DESCRIPTION OF THE DRAWINGS

Features and advantages of the disclosure will readily be appreciated by persons skilled in the art from the following detailed description when read in conjunction with the drawing wherein.

DETAILED DESCRIPTION

Figure 1:
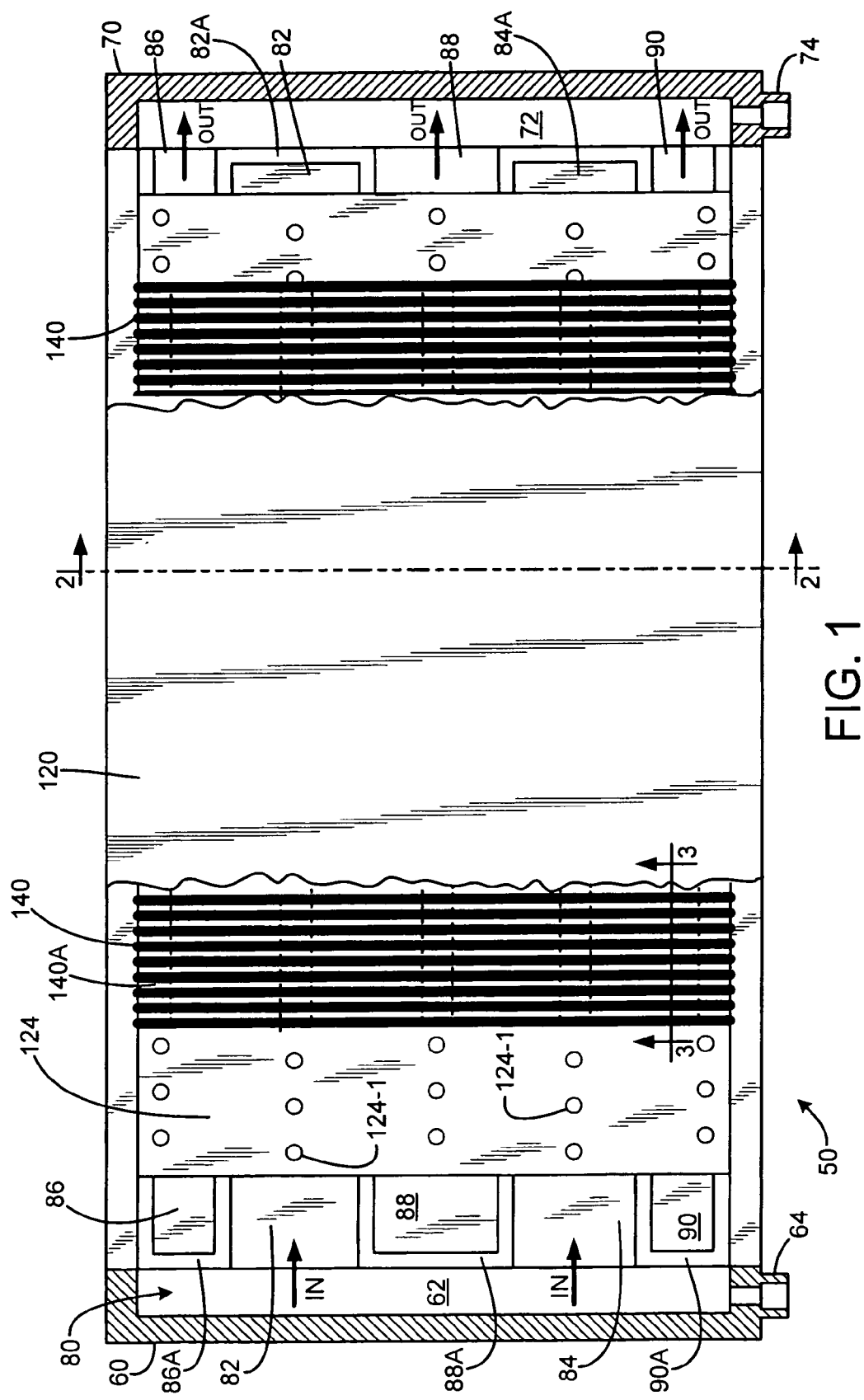
FIG. 1 is a partially broken-away side view of an exemplary embodiment of a cold plate assembly.

In the following detailed description and in the several figures of the drawing, like elements are identified with like reference numerals. The figures are not to scale, and relative feature sizes may be exaggerated for illustrative purposes.

Figure 3:
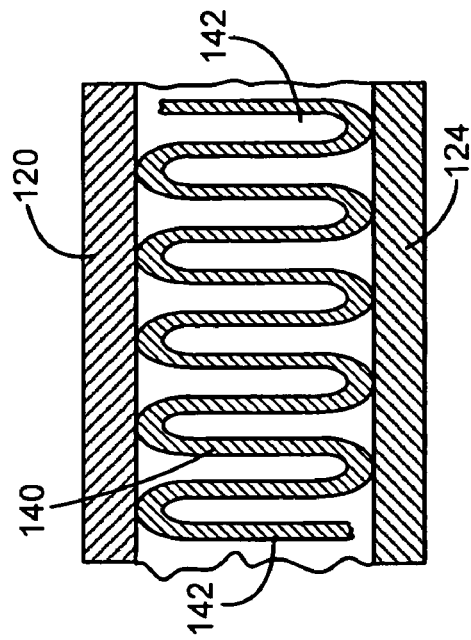
FIG. 3 is a partial cross-sectional view illustrating an exemplary embodiment of fin material assembled between a metering plate and a cover plate of the cold plate assembly of FIG. 1.
Figure 2:
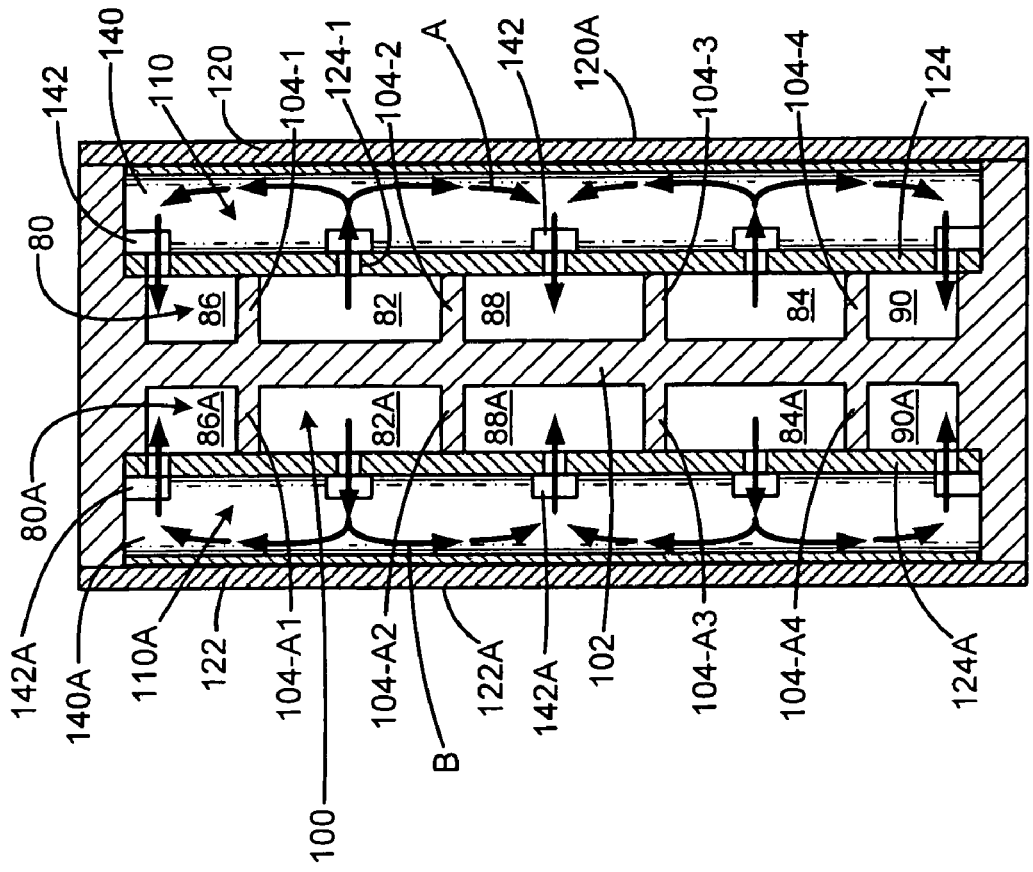
FIG. 2 is a side cross-sectional view of the cold plate assembly of FIG. 1.

An exemplary embodiment of a cold plate assembly 50 is illustrated in FIGS. 1–3. This exemplary embodiment provides two side surfaces 120A, 122A (FIG. 2) to which electrical components may be mounted for cooling, although in other embodiments, only one side mounting surface may be used.

In this exemplary embodiment, coolant fluid is supplied to and exits from the cold plate assembly via vertical chimney manifolds 60, 70 at either end of the cold plate assembly. The manifold 60 defines an input plenum 62 which is in fluid communication with an input port 64 and with input sub-manifolds or channels 82, 84 of a manifold layer 80. Similarly, the output manifold 70 defines an output plenum 72 which is in fluid communication with an output port 74 and with output sub-manifolds or channels 86, 88 and 90 of the manifold layer. In this embodiment, the coolant fluid enters the assembly 50 through port 64, and the coolant fluid exits the assembly through port 74.

The assembly 50 is further illustrated in the simplified cross-sectional view of FIG. 2, taken along line 2—2 of FIG. 1 intermediate the manifolds 60, 70. In this embodiment, two manifold layers 80, 80A are separated by a manifold divider plate structure 100 and sandwiched between two core layers 110, 110A. Outer cover plates 120, 122 are disposed outwardly of the core layers; their respective outer surfaces 120A, 122A provide the cooling surfaces to which components such as electrical circuit devices may be attached. Metering plates 124, 124A are respectively sandwiched between the manifold structure 100 and the core layer 110, and between the manifold structure 100A and the core layer 110A.

Corrugated foil finstock structures 140, 140A are respectively positioned in the core layers 110, 110A, as shown in FIGS. 1–3. In an exemplary embodiment, the finstock structures are high density stamped or machined finstock, fabricated of stamped aluminum foil corrugated fin material. In an exemplary embodiment, the finstock material has a very high pitch count (60 to 90 fins per inch) and a height in a range of 0.03 inch to 0.08 inch.

The manifold divider plate structure 100 can be fabricated of aluminum or other material which is compatible with the coolant fluid, and which preferably is thermally conductive. The structure 100 defines a divider plate portion or member 102 which is generally flat and parallel to the cover plates 120, 122 and to the metering plates 124, 124A. The structure 100 also includes channel walls 104-1, 104-2, 104-3, 104-4 running the length of the manifold layer, and generally perpendicular to one side of the divider plate 102, and walls 104A-1, 104A-2, 104A-3, 104A-4 running the length of the manifold layer and generally perpendicular to the other side of the divider plate 102. These walls partially define the sub-manifolds or channels 82, 84, 86, 88 and 90. In an exemplary embodiment, the channels 82, 84, 90 are each 0.2 inch wide by 0.2 inch high, and channels 86, 90, adjacent edges of the structure, are each 0.2 inch wide by 0.1 inch high.

Each metering plate 124, 124A in an exemplary embodiment is a thin plate with small drilled hole, slot or pore openings arranged to regulate the flow of coolant fluid into and out of the core layers 110, 110A. For example, plate 124 has openings 124-1 formed there through, as illustrated in FIGS. 1 and 2. The metering plate openings can be arranged in a regular pattern of identical sizes for an even distribution, or variable sizes to deliver different flow rates to different sections of the core layer where heat densities (e.g. by electrical circuit components mounted on the cooling surfaces) applied to the cover plate are non-uniform. In one exemplary embodiment, the metering plate 124 has a thickness in a range of 0.025 inch to 0.050 inch. The openings 124-1 in one exemplary embodiment are holes with a diameter in a range of 0.01 inch to 0.02 inch. An alternate exemplary embodiment has openings 124-1 in the form of slots, e.g. 0.01 inch wide by 0.125 inch to 0.2 inch long, separated by gaps, e.g. on the order of 0.025 inch gaps. Of course, other embodiments may employ openings of different sizes and spacings.

Referring now to FIG. 1, coolant fluid enters the input port 64 and into the input plenum 62. The fluid then enters the respective manifold layer supply sub-manifolds 82, 84 (see arrows marked AIN@) and begins to traverse laterally under the metering plate 124. Along the supply sub-manifolds, differential pressure drives the coolant fluid through the openings 124-1 in the metering plate and into the core layer 110. Portions of the cover plate, fin material and metering plate structures have been removed in FIG. 1 for clarity.

Figure 4:
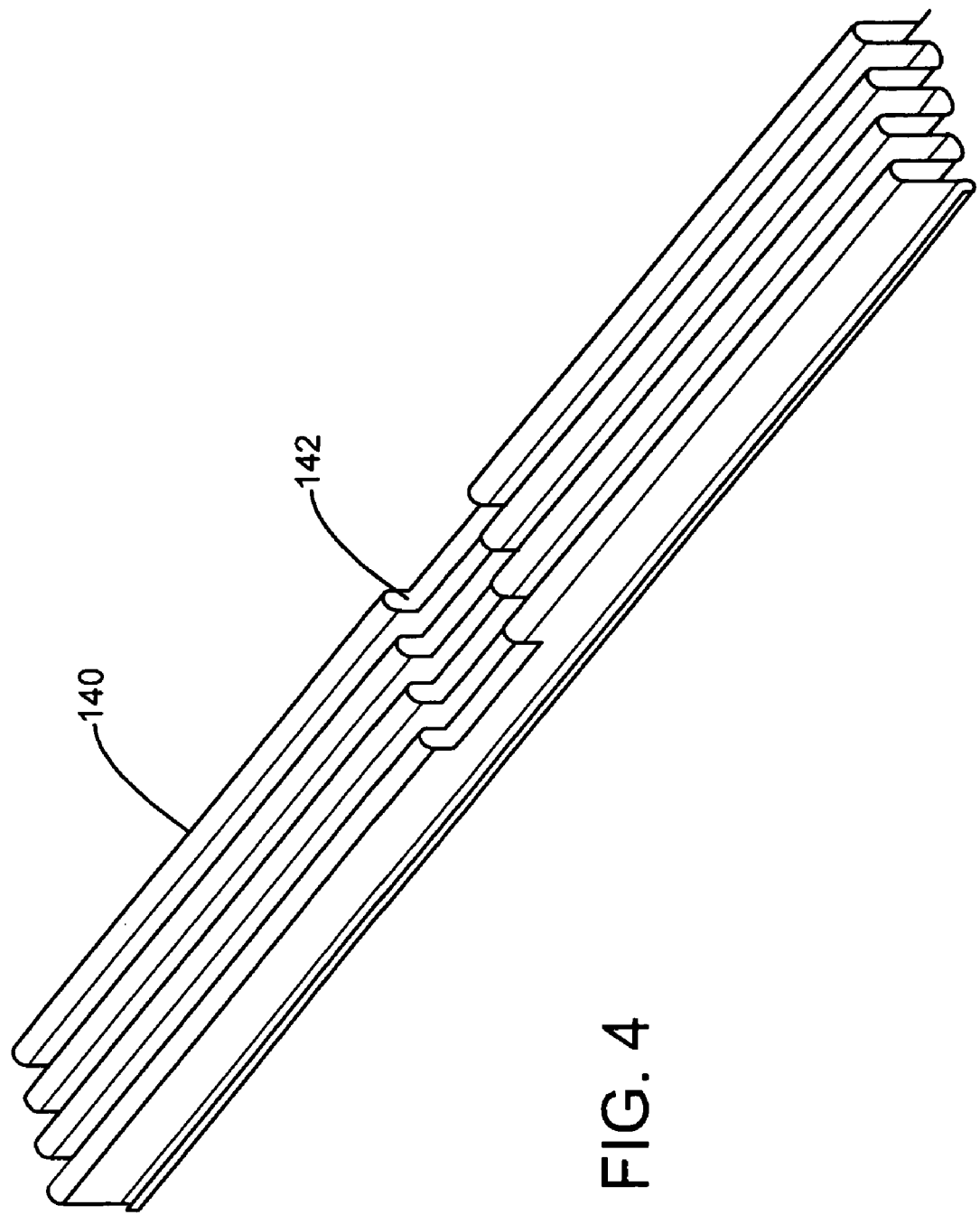
FIG. 4 is an isometric view of a portion of an exemplary finstock structure.

In an exemplary embodiment, the cold plate core layers 110, 110A each comprises corrugated foil fin material 140, 140A. Coolant fluid enters the core layer from the metering plate openings via notches, e.g. notches 142, cut into the finstock structures 140, 140A to permit the coolant to wet all surfaces of the finstock structures. In an exemplary embodiment, the notches are cut or formed in the finstock structures to a depth of approximately one half the fin depth, and may have a length in an exemplary range of 0.05 inch to 0.1 inch. FIG. 4 is an isometric view of a portion of an exemplary finstock structure 140, showing notches 142. The notches provide short, parallel high performance flow paths that run the length of the cooled assembly. Exemplary flow paths are marked in FIG. 2 as arrows "A" and "B," and show fluid flow between the input sub-manifolds, through the notches in the finstock, into the core-layer, and then into the output sub-manifolds. Thus, the coolant fluid travels laterally as illustrated in the cross-sectional view of FIG. 2, and exits the respective core layers through the openings in the corresponding metering plate. Exhaust coolant fluid accumulates in the manifold layer return sub-manifolds as shown by arrows marked AOUT@ (FIG. 1) and is discharged from the cold plate assembly. One exemplary liquid coolant suitable for use is polyalphaolephin (PAO), a hydraulic oil.

In an exemplary embodiment, the cold plate assembly may be fabricated by vacuum or inert gas brazing the individual elements, followed by post braze finished machining. Exemplary techniques for forming the notches in the corrugated fin material include use of a wire or a plunge electromagnetic discharge process. In an exemplary embodiment, the notches are cut in the finstock prior to brazing the finstock in place. The finstock material may be brazed between the respective metering and cover plates.

An exemplary application for the cold plate assembly is for a liquid flow through cold plate for very high output power conditioning electronics used in aerospace applications. In an exemplary embodiment, a cold plate assembly is a modular assembly which is nine inches long and five inches wide, with electronics components populating both sides of the assembly and dissipating more than 10000 watts of heat. Of course, such dimensions and heat dissipation capacity are merely exemplary.

Although the foregoing has been a description and illustration of specific embodiments of the invention, various modifications and changes thereto can be made by persons skilled in the art without departing from the scope and spirit of the invention as defined by the following claims.

What is claimed is:

1. A cold plate assembly, comprising:
    a manifold layer comprising one or more input coolant sub-manifold channels and one or more output coolant sub-manifold channels;
    a metering plate having a plurality of orifices defined there through;
    a cover plate arranged in spaced relation relative to the metering plate;
    a core layer disposed between the metering plate and cover plate, said core layer comprising corrugated fin material;
    wherein said one or more input sub-manifold channels and said one or more output sub-manifold channels are in fluid communication only through fluid paths passing through said orifices in said metering plate and said core layer.

2. The cold plate assembly of claim 1, wherein said one or more input coolant sub-manifold channels and said one or more output coolant sub-manifold channels extend longitudinally in a generally parallel configuration.

3. The cold plate assembly of claim 1, wherein said manifold layer has a rectilinear configuration.

4. The cold plate assembly of claim 1, wherein said manifold layer comprises a wall structure separating said one or more input coolant sub-manifold channels and said one or more output coolant sub-manifold channels, and said metering plate is connected to said wall structure.

5. The cold plate assembly of claim 2, wherein said corrugated fin material has corrugations which extend transversely to a longitudinal extent of said one or more input coolant sub-manifold channels and said one or more output coolant sub-manifold channels.

6. The cold plate assembly of claim 1 wherein said corrugated fin material includes finstock elements having at least about 50 fins per inch.

7. The cold plate assembly of claim 1, wherein said one or more input coolant sub-manifold channels and said one or more output coolant sub-manifold channels are generally parallel and arranged in an inter-digitated arrangement.

8. The cold plate assembly of claim 1, further comprising an input plenum in fluid communication with said one or more input coolant sub-manifold channels, and an output plenum in fluid communication with said one or more output coolant sub-manifold channels.

9. The cold plate assembly of claim 8, further comprising an input port in fluid communication with said input plenum for introducing a coolant fluid into the heat exchanger, and an output port in fluid communication with said output plenum for outputting the coolant fluid from the heat exchanger.

10. The cold plate assembly of claim 1, wherein said cover plate has an external surface for attachment of heat producing electronic devices.

11. The cold plate assembly of claim 1, wherein said cover plate and said metering plate are planar structures arranged in parallel.

12. The cold plate assembly of claim 1, wherein said corrugated fin material has notches formed therein, and said fluid paths include fluid paths extending transverse to said one or more input coolant sub-manifold channels.

13. The cold plate assembly of claim 1 wherein said corrugated fin material includes finstock elements having at least about 50 fins per inch, and said corrugated fin material has a fin height dimension in a range of 0.03 inch to 0.08 inch.

14. The cold plate assembly of claim 1, wherein said finstock material is attached by brazing to said cover plate and said metering plate.

15. A cold plate assembly, comprising:
    first and second planar cover plates arranged in parallel spaced relation;
    first and second planar metering plates, each said plate having a plurality of orifices defined there through, said metering plates arranged in parallel to said cover plates and disposed in spaced relation inwardly of said first and second cover plates;

a manifold divider plate structure defining a divider plate portion which is generally flat and parallel to the cover plates and to the metering plates, said plate structure including channel walls extending on opposite sides of the divider plate portion, said walls partially defining a first set of sub-manifold input channels and a first set of sub-manifold output channels on a first manifold layer side of the divider plate portion and a second set of sub-manifold input channels and a second set of sub-manifold output channels on a second manifold layer side of the divider plate portion;

first and second core layers respectively disposed between the first metering plate and first cover plate and between the second metering plate and the second cover plate, each said core layer comprising corrugated fin material;

wherein said first set of input sub-manifold channels and said first set of output sub-manifold channels are in fluid communication only through fluid paths passing through said orifices in said first metering plate and said first core layer;

wherein said second set of input sub-manifold channels and said second set of output sub-manifold channels are in fluid communication only through fluid paths passing through said orifices in said second metering plate and said second core layer.

16. The cold plate assembly of claim 15, wherein said first manifold layer and said second manifold layer each has a rectilinear configuration.

17. The cold plate assembly of claim 15, wherein said first metering plate is connected to said first wall structure, and said second metering plate is connected to said second wall structure.

18. The cold plate assembly of claim 15, wherein said corrugated fin material has corrugations which extend transversely to a longitudinal extent of said first set of input coolant sub-manifold channels and said first set of output coolant sub-manifold channels.

19. The cold plate assembly of claim 15 wherein said corrugated fin material includes finstock elements having at least about 50 fins per inch.

20. The cold plate assembly of claim 15, wherein said first set of input coolant sub-manifold channels and said first set of output coolant sub-manifold channels are arranged in an inter-digitated arrangement.

21. The cold plate assembly of claim 15, further comprising an input plenum in fluid communication with said first set and said second set of input coolant sub-manifold channels, and an output plenum in fluid communication with said first set and said second set of output coolant sub-manifold channels.

22. The cold plate assembly of claim 21, further comprising an input port in fluid communication with said input plenum for introducing a coolant fluid into the heat exchanger, and an output port in fluid communication with said output plenum for outputting the coolant fluid from the heat exchanger.

23. The cold plate assembly of claim 15, wherein said first cover plate has a first external surface for attachment of heat producing electronic devices, and said second cover plate has a second external surface for attachment of heat producing electronic devices.

24. The cold plate assembly of claim 15, wherein said corrugated fin material has notches formed therein to permit coolant to wet all surfaces of the fin material.

25. A cold plate assembly, comprising:

a manifold layer comprising one or more input coolant sub-manifold channels and one or more output coolant sub-manifold channels;

a metering plate having a plurality of orifices defined there through;

a cover plate arranged in spaced relation relative to the metering plate;

a core layer disposed between the metering plate and cover plate, said core layer comprising corrugated fin material having a plurality of openings formed through the fin material;

said one or more input sub-manifold channels and said one or more output sub-manifold channels are in fluid communication through fluid paths passing through said orifices in said metering plate, said plurality of openings formed through the fin material and said core layer.

26. The assembly of claim 25, wherein said one or more input coolant sub-manifold channels and said one or more output coolant sub-manifold channels extend longitudinally in a generally parallel configuration.

27. The assembly of claim 26, wherein said manifold layer comprises a wall structure separating said one or more input coolant sub-manifold channels and said one or more output coolant sub-manifold channels, and said metering plate is connected to said wall structure.

28. The assembly of claim 25, wherein said corrugated fin material has corrugations which extend transversely to a longitudinal extent of said one or more input coolant sub-manifold channels and said one or more output coolant sub-manifold channels.

29. The assembly of claim 25, wherein said fluid paths are oriented transverse to said one or more input sub-manifold channels and said one or more output sub-manifold channels.

30. The assembly of claim 25 wherein said corrugated fin material includes finstock elements having at least about 50 fins per inch.

* * * * *